United States Patent [19]
Koyano et al.

[11] Patent Number: 5,820,104
[45] Date of Patent: Oct. 13, 1998

[54] VERTICAL TRANSFER SYSTEM FOR A VACUUM CHAMBER AND GATE VALVE ASSEMBLY

[75] Inventors: Shinji Koyano; Ryuichi Matsuzaki, both of Narashino, Japan

[73] Assignee: Seiko Seiki Kabushiki Kaisha, Japan

[21] Appl. No.: 591,693

[22] Filed: Jan. 25, 1996

[30] Foreign Application Priority Data

Jan. 27, 1995 [JP] Japan ..................................... 7-012041
Jan. 27, 1995 [JP] Japan ..................................... 7-012042

[51] Int. Cl.⁶ ................................................. F16K 31/08
[52] U.S. Cl. ................ 251/326; 251/129.15; 251/129.2; 251/65; 310/12
[58] Field of Search .................................. 251/65, 129.2, 251/129.15, 129.09, 129.1, 326; 310/12, 15

[56] References Cited

U.S. PATENT DOCUMENTS

| | | | |
|---|---|---|---|
| 4,650,132 | 3/1987 | Graf et al. ........................ | 310/90.5 X |
| 4,747,577 | 5/1988 | Dimock ................................. | 251/65 X |
| 5,039,061 | 8/1991 | Heard et al. ............................ | 251/65 |
| 5,069,422 | 12/1991 | Kawamura ............................ | 251/65 X |
| 5,309,049 | 5/1994 | Kawada et al. ........................ | 310/12 |
| 5,350,275 | 9/1994 | Ishimaru ................................. | 415/90 |
| 5,590,515 | 1/1997 | Boden ..................................... | 57/264 |

*Primary Examiner*—Kevin Lee
*Attorney, Agent, or Firm*—Adams & Wilks

[57] ABSTRACT

A vacuum-oriented vertical transfer system which provides super vacuum/super clean environments, and a gate valve assembly which reduces the size of electromagnet sections. The vacuum-oriented vertical transfer system includes a cylindrical partition wall, and a rod vertically moved through an open bottom of a vacuum container. The rod is floatingly supported in radial and axial directions thereof by a radial magnetic support device and an axial magnetic support device, respectively. The gate valve assembly comprises a closure member mounted for positioning adjacent to and away from a port of a container to close and open the port, respectively. A neck member is integrally connected to the closure member and is mounted for movement to position the closure member to open and close the port of the container. A radial magnet device levitates the neck member by magnetic forces in a radial direction thereof. An axial magnetic device levitates the neck member by magnetic forces in an axial direction thereof. A moving mechanism moves the neck member to position the closure member to open and close the port of the container.

23 Claims, 9 Drawing Sheets

F I G. 1
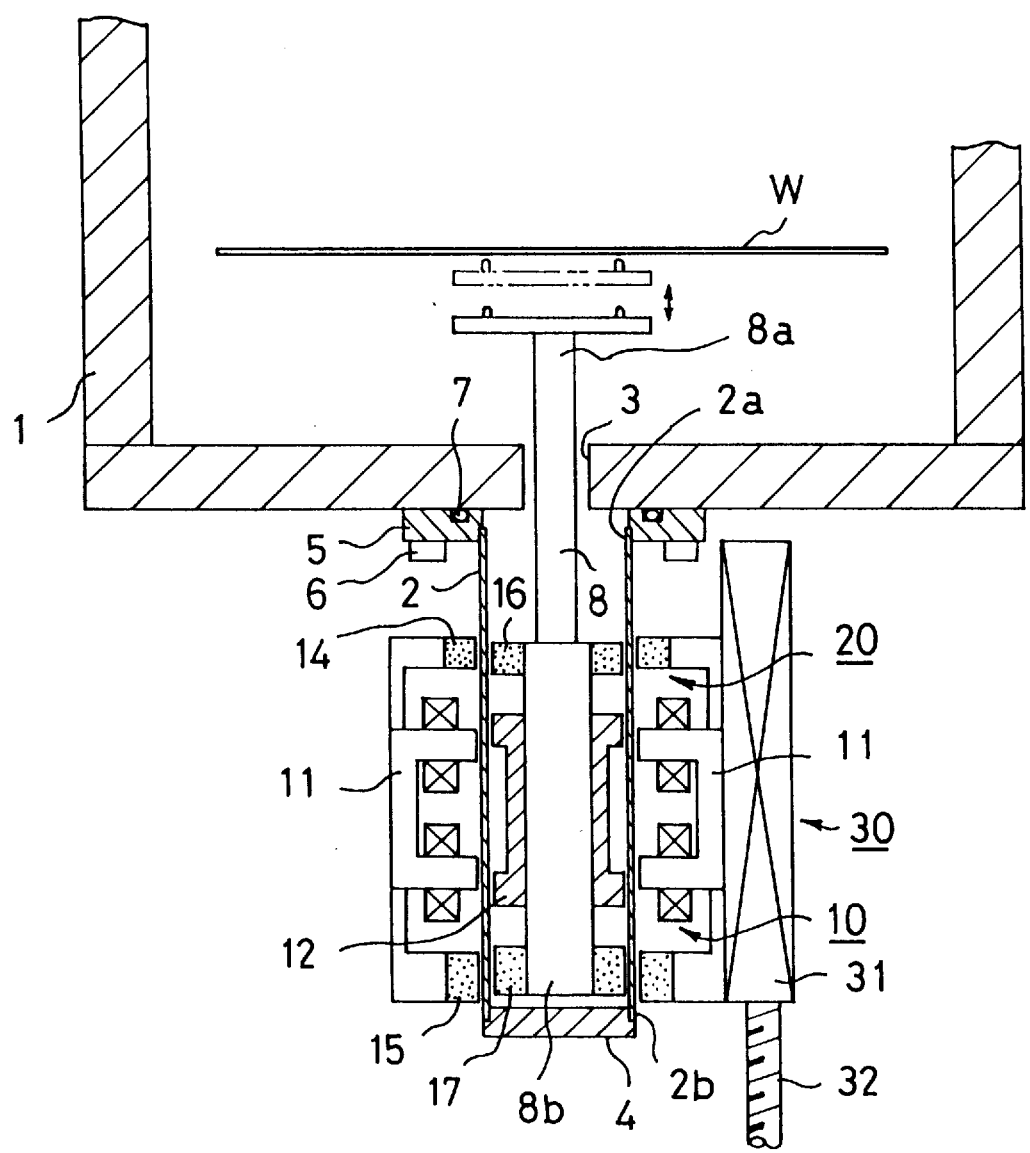

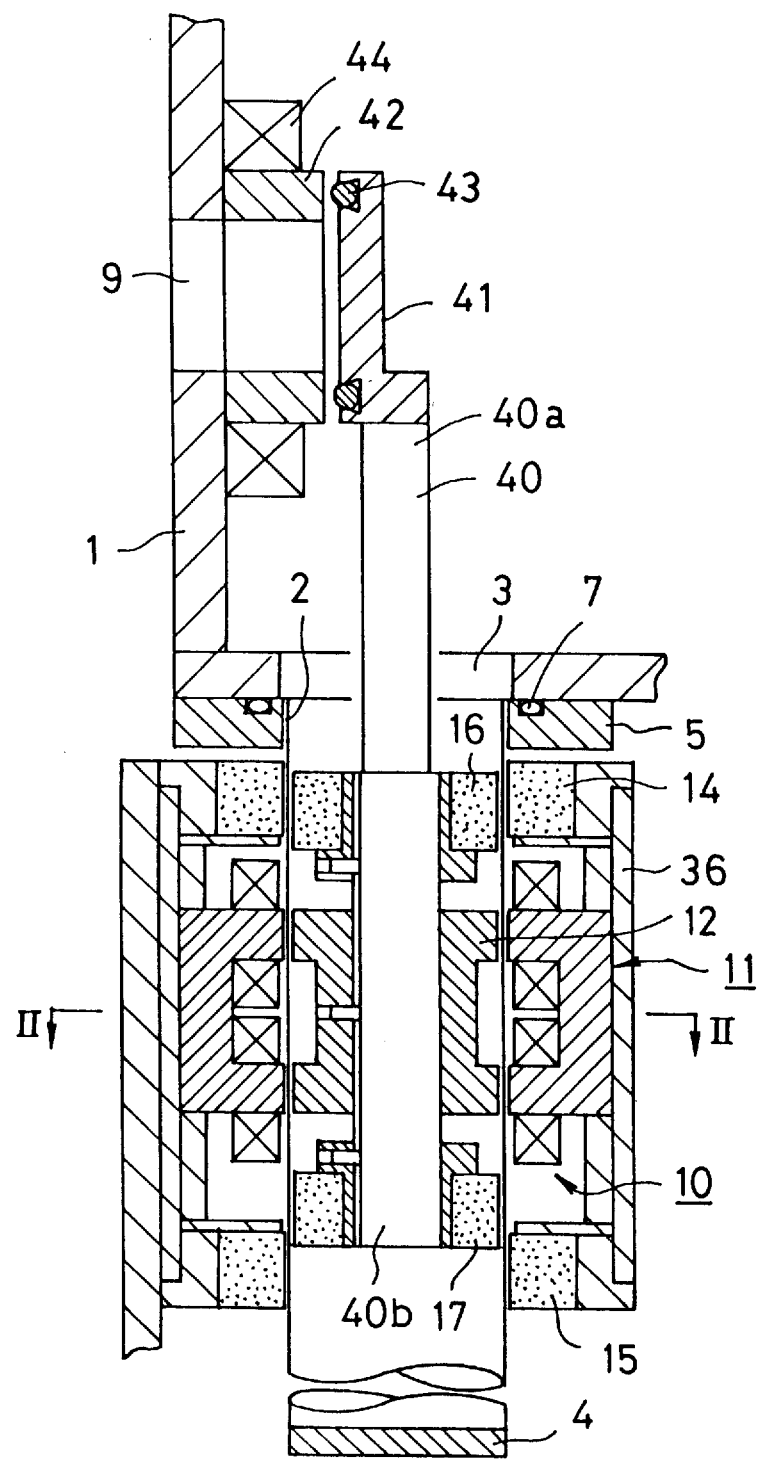
F I G. 4

F I G. 6
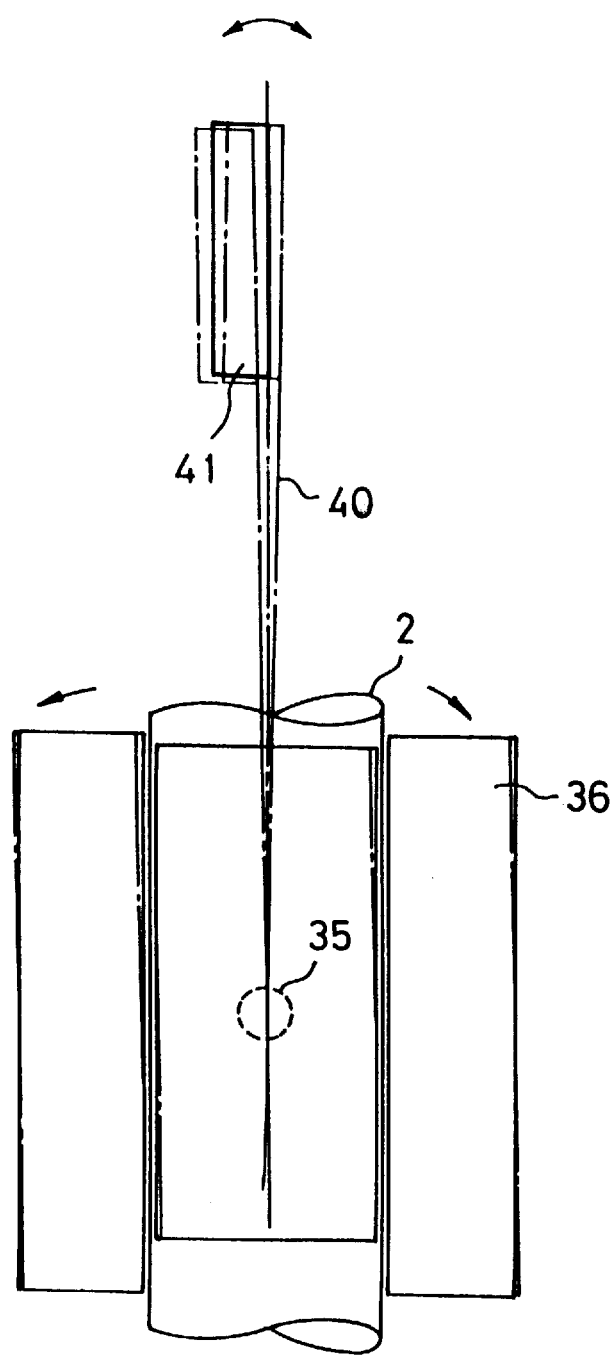

ed since the metal bellows 60 has a large surface area. The gases tend to be accumulated on the surface of the metal bellows 60. It is thus difficult to provide super vacuum/super clean environments. When the load is repeatedly exerted about 50,000 times, leakage also occurs in the welds of the metal bellows. This results in a decrease in the service life of the system.

VERTICAL TRANSFER SYSTEM FOR A VACUUM CHAMBER AND GATE VALVE ASSEMBLY

BACKGROUND OF THE INVENTION

This invention relates to a vacuum-oriented vertical transfer system adapted to feeding and receiving a workpiece such as a silicon wafer within a vacuum container which is used, for example, in a semiconductor fabrication/inspection system or a liquid crystal board fabrication/inspection system, and to a gate valve assembly for opening and closing a port defined to provide a communication between two chambers under different pressures, for example, one under vacuum and the other under atmospheric pressure, or one under high vacuum and the other under super vacuum.

FIG. 3 shows a conventional vacuum-oriented vertical transfer system for vertically feed and receive a workpiece within a vacuum chamber.

Specifically, this system includes a metal bellows 60 adapted to separately form a vacuum environment and an atmospheric environment within a vacuum container 1. The metal bellows 60 is situated at an open bottom 3 of the vacuum container 1. The outside environment of the metal bellows is identical to the (vacuum) environment of the vacuum container 1. The inside environment of the metal bellows is an ambient air atmosphere. A shaft 61 is vertically movable within the metal bellows. The shaft 61 has a front end integrally attached to a lid 60a of the metal bellows 60 and a rear end integrally attached to a piston within a cylinder 62.

When the piston of the cylinder 62 causes vertical movement of the shaft 61, the metal bellows 60 is expanded and contracted within the vacuum container 1. As this occurs, a workpiece W is vertically moved to and from the front end of the metal bellows 60.

FIG. 9 illustrates the structure of a conventional gate valve assembly adapted for use with a vacuum chamber and located between two vacuum containers.

Specifically, this assembly includes a rod 64. A seal 65 is attached to the front end of the rod 64 to open and close a port 9 of the vacuum container 1. The rod 64 is disposed within a partition wall 2 which is communicated with the vacuum container 1. A displacement sensor 66 and an electromagnet section 67 are provided externally of the partition wall 2. The displacement sensor 66 detects the extent of displacement of the rod 64. The electromagnet section 67 is excited based on the result as sensed by the displacement sensor 66. The resulting magnetic force attracts a magnetic target 68 of the rod 64 and thus, floatingly supports the rod 64 in a radial direction as well as in an axial direction.

With the gate valve assembly thus constructed, to close the port 9, the rod 64 is radially translated under the control of an exciting current to the electromagnet section 67 so as to urge the seal 65 into contact with the port 9. This contact causes plastic deformation of o-rings 43 of the seal 65 and thus, closing of the port 9. To open the port 9, the rod 64 is translated in a reverse direction so as to move the seal 65 away from the port 9.

In such a conventional vacuum-oriented vertical transfer system, however, the metal bellows 60 is subject to expansion and contraction within the vacuum container 1 as explained earlier. As this occurs, a load is repeatedly exerted on welds of the metal bellows 60 to thereby produce metal powder. Moreover, a substantial amount of gases are gen- In the prior art gate valve assembly, the distance D (at least 2.5 mm) between the electromagnet section 67 and the magnetic target 68 is the sum of the deformation amount (approximately 1 mm) of the o-rings 43, the clearance (approximately 0.5 mm) between the o-rings 43 and the vacuum container 1, and the clearance (approximately 0.5 mm) between the partition wall 2 and the electromagnet section 67. The distance between the electromagnet section 67 and the magnetic target 68 is quite long. Moreover, the electromagnet section 67 not only supports the rod 64 in a radial direction, but also bears a thrust load from the rod 64. To this end, a large electromagnet needs be provided. This increases the size and the production cost of the entire assembly. Also, such an electromagnet generates a large amount of heat.

SUMMARY OF THE INVENTION

Accordingly, it is an object of the present invention to provide a vacuum-oriented vertical transfer system suitably designed to provide super vacuum/super clean environments and increase the service life of system components. Another object of the present invention is to provide a gate valve assembly suitably designed to minimize the size of an electromagnet section and thus, reduce the fabrication cost and size of the assembly and decrease the amount of heat.

In order to achieve the foregoing and other objects, the present invention provides a transfer system which comprises a cylindrical partition wall provided externally of a vacuum container and having a first end open to an open bottom of the vacuum container and a second closed end, a rod capable of vertical movement through the open bottom of the vacuum container and having a front end located within the vacuum container and a rear end located within the partition wall, radial magnetic support means for applying a magnetic force from outside of the partition wall so as to floatingly support the rod in a radial direction, axial magnetic support means for applying a magnetic force from outside of the partition so as to floatingly support the rod in an axial direction, and vertical transfer means for vertically moving the radial magnetic support means along the partition wall.

According to another feature of the present invention, the radial magnetic support means comprises radial electromagnets arranged adjacent to the outer peripheral surface of the partition wall and adapted to attract a magnetic target integrally mounted to the outer peripheral surface of the rod. The axial magnetic support means comprises outer permanent magnets arranged adjacent to the outer peripheral surface of the partition wall and adapted to produce a repulsive force relative to inner permanent magnets integrally mounted to the outer peripheral surface of the rod. The vertical transfer means comprises a transfer body and a transfer mechanism for vertically moving the transfer body along the partition wall. The radial electromagnets and the outer permanent magnets are integrally mounted to the transfer body.

According to a further feature of the present invention, the radial magnetic support means and the vertical transfer means comprise a linear pulse motor body arranged adjacent to the outer peripheral surface of the partition wall, and a comb-like magnetic target integrally attached to the outer peripheral surface of the rod in a face-to-face relation to the linear pulse motor body.

Also, in order to achieve the foregoing object, the present invention provides a gate valve assembly which comprises a closure member arranged to face with a port of a container, a neck integrally formed on one side of the closure member, radial magnetic support means including radial electromagnetic sections for floatingly supporting the neck in a radial direction under a magnetic force, outer permanent magnets for floatingly supporting the neck in an axial direction under a repulsive force generated between the outer permanent magnets and inner permanent magnets integrally mounted to the neck, and swing means for swinging the neck back and forth toward the port of the container whereby the port is opened and closed by the closure member.

With the gate valve assembly of the present invention, the swing means comprises a rotary mechanism for rotating the radial magnetic support means and the outer permanent magnets. Also, with the gate valve assembly of the present invention, the radial magnetic support means comprises a first radial electromagnet section and a second electromagnet section arranged along the axis of the neck. The swing means comprises a swing controller for controlling an exciting current to at least one of the first and second radial electromagnet sections so as to change the radial floating position of the neck.

With the gate valve assembly of the present invention, the closure member is made of a magnetic material. A resilient seal member is disposed between the port of the container and the closure member. A sealing electromagnet is provided to attract the closure member toward the port of the container.

The present invention further provides a gate valve assembly which comprises a cylindrical seal block having an inclined, front end and a rear end connected to a port of a container, a closure member located adjacent to the seal block and having an inclined portion arranged in a face-to-face relation to the inclined end, a resilient seal member disposed between the inclined portion of the closure member and the inclined end of the seal block, a neck mounted to the lower end of the closure member, a radial electromagnet section for floatingly support the neck in a radial direction under a magnetic force, outer permanent magnets for floatingly support the neck in an axial direction under a repulsive force generated between the outer permanent magnets and inner permanent magnets integrally mounted to the neck, and a sealing electromagnet for axially attracting the neck whereby the inclined portion the closure member is brought into close contact with the inclined end of the seal block.

With the vertical transfer system of the present invention, as the radial magnetic support means and the axial magnetic support means are vertically moved along the partition wall, the rod is vertically moved therewith within the partition wall. That is, the rod is vertically moved without being subjected to expansion and contraction while it is floatingly supported under a magnetic force. During this movement, a workpiece is transferred to and from the front end of the rod.

Also, with the gate valve assembly of the present invention, the outer permanent magnets bear a thrust load from the neck. Thus, the radial electromagnet section only serves to radially support the neck in a floating fashion.

Further, during swing motion of the neck, the closure member is substantially moved back and forth. While the neck is only slightly swung, the stroke of the closure member is long enough to open and close the port.

The sealing electromagnet produces a force so as to plastically deform the resilient seal member. This insures closing of the port.

Moreover, the neck of the closure member is reciprocated in an axial direction, and the sealing electromagnet produces a force to plastically deform the resilient seal member. This insures closing of the port.

BRIEF DESCRIPTION OF THE DRAWINGS

FIG. 1 is a sectional view of a vertical transfer system according to one embodiment of the present invention;

FIG. 4 is a sectional view of a gate valve assembly according to one embodiment of the present invention;

FIG. 6 is an operational view of the gate valve assembly shown in FIG. 4;

DETAILED DESCRIPTION OF THE PREFERRED EMBODIMENTS

Figure 2:
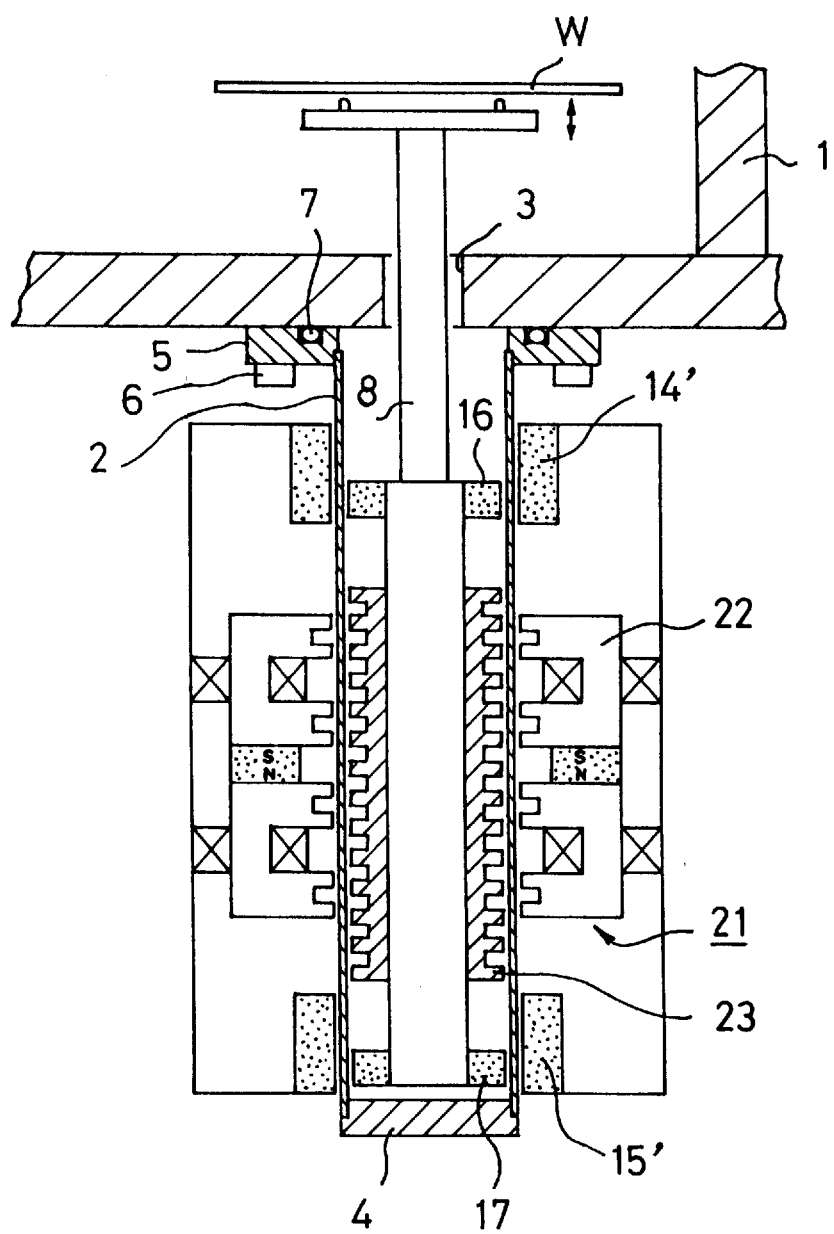
FIG. 2 is a sectional view of a vertical transfer system according to a second embodiment of the present invention.
Figure 3:
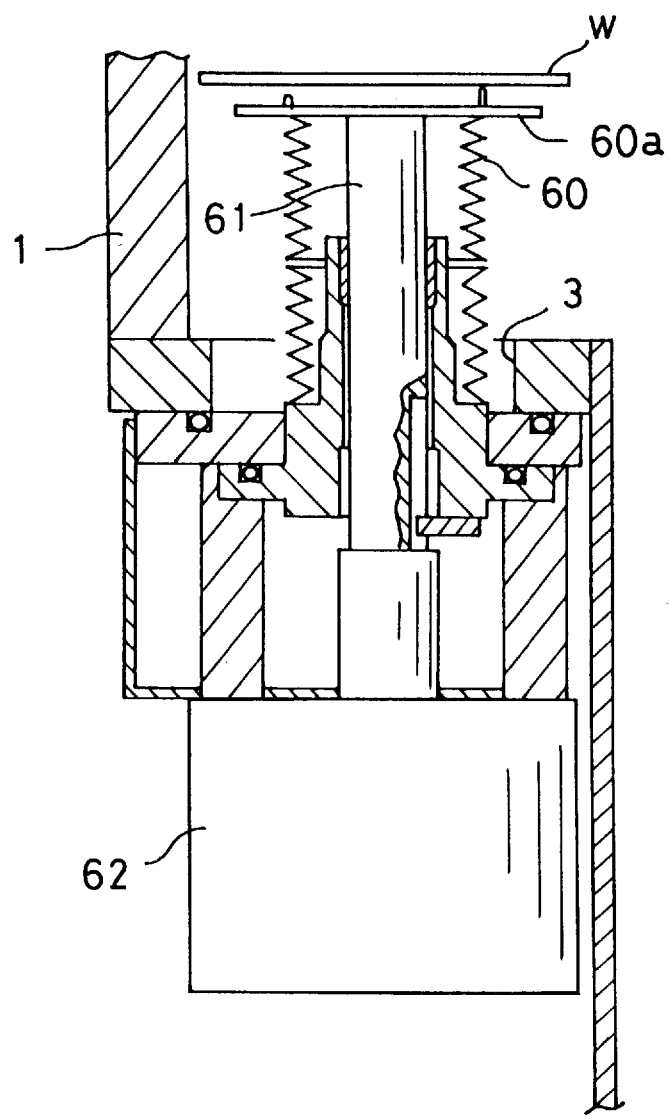
FIG. 3 is a sectional view of a conventional vacuum-oriented vertical transfer system.

A vacuum-oriented vertical transfer system according to one embodiment of this present invention will now be described in detail with reference to FIGS. 1 and 2.

As shown in FIG. 1, this vacuum-oriented vertical transfer system includes a metal partition wall 2 for separately forming a vacuum environment and an atmospheric environment. The partition wall 2 is cylindrical in shape and is located externally of a vacuum container 1.

The partition wall 2 has one end 2a open to an open bottom 3 of the vacuum container 1 and fixedly secured to the vacuum container 1 and another end 2b closed by a lid 4.

Securement of the vacuum container 1 and the partition wall 2 is effected by a flange 5 extending around the one end 2a of the partition wall 2 and screws 6 for securing the flange 5 to the vacuum container 1. Sealing members 7 are disposed between the flange 5 and the vacuum container 1 so as to provide a seal therebetween.

A rod 8 is vertically movable through the open bottom 3 of the vacuum container 1. The rod 8 has a front end 8a located within the vacuum container 1 and a rear end located within the partition wall 2.

A magnetic force is applied from outside of the partition wall 2 so as to floatingly support the rod 8 in a radial direction. A radial magnetic support means 10 floatingly supports the rod 8 in a radial direction and includes a radial electromagnetic section 11 composed of a plurality of radial electromagnets 11 and a radial displacement sensor section, not shown.

The radial electromagnetic section 11 is arranged around the outer peripheral surface of the partition wall 2. The radial displacement sensor section, not shown, detects radial displacement of the rod 8 and sends a corresponding output to a control circuit (not shown). The control circuit, in turn, controls an exciting current to the radial electromagnetic section based on the result as sensed by the radial displacement sensor section so as to adjust an attraction force of the radial electromagnets.

A magnetic target 12 is disposed within the partition wall 2 and integrally formed on the outer peripheral surface of the rod 8 in a face-to-face relation to the radial electromagnets of the radial electromagnetic section 11.

With the attraction force of the radial electromagnets, the radial magnetic support means 10 attracts the magnetic target 12 and floatingly supports the rod 8 in a radial direction so as to maintain the distance between the radial electromagnetic section 11 and the magnetic target 12 constant.

The rod 8 is also floatingly supported in an axial direction by an attraction force applied from outside of the partition wall 2. To floatingly support the rod 8 in its axial direction, there is provided an axial magnetic support means 20 which includes a pair of upper and lower, outer permanent magnets 14, 15 provided externally of the partition wall 2.

The outer permanent magnets 14, 15 cooperate with a pair of inner permanent magnets 16, 17 to produce a repulsive force. The inner permanent magnets 16, 17 are arranged within the partition wall 2. The inner permanent magnets 16, 17 are located above and below the magnetic target 12 and integrally formed on the outer peripheral surface of the rod 8.

The upper outer permanent magnet 14 is located slightly above the upper inner permanent magnet 16. The lower outer permanent magnet 15 is located slightly below the lower inner permanent magnet 17.

That is, with the repulsive force between the outer permanent magnets 14, 15 and the inner permanent magnets 16 17, the axial magnetic support means 20 floatingly supports the rod 8 in its radial direction and bears an axial load (thrust force) exerted on the rod 8.

A vertical transfer means 30 is provided externally of the partition wall 2 so as to vertically move the radial magnetic support means 10 and the axial magnetic support means 20 along the partition wall 2. The vertical transfer means 30 includes a transfer body 31 and a transfer mechanism 32. The radial electromagnetic section 11 and the pair of upper and lower, outer permanent magnets 14, 15 are integrally connected to the transfer body 31. The transfer mechanism 32 is constructed to vertically move the transfer body 31 along the partition wall 2.

The transfer mechanism 32 takes the form, for example, of a feed screw or a slide mechanism composed of an air cylinder and a guide.

Operation of the vacuum-oriented vertical transfer system thus constructed will next be described with reference to FIG. 1.

With this vacuum-oriented vertical transfer system, the rod 8 is floatingly supported in its axial direction under a repulsive force between the inner permanent magnets 16, 17 and the outer permanent magnets 14, 15.

As the radial magnetic support means 10 is actuated, the radial electromagnets produce an attraction force so as to floatingly support the rod 8 in its radial direction.

After the rod 8 is floatingly supported in its radial and axial directions, the transfer mechanism 32 is operated to vertically move the transfer body 31. The rod 8 is vertically moved with the transfer body 31 within the vacuum container 1 and the partition wall 2. This vertical movement of the rod 8 allows for vertical transfer of a workpiece W to and from the front end of the rod 8.

Accordingly, with the vertical transfer system of this embodiment, the rod 8 is vertically moved without being subjected to expansion and contraction while it is floating supported within the vacuum container 1 under a magnetic force. In other words, this embodiment eliminates the need for metal bellows as in the prior art system. Advantageously, the rod 8 has no bellows or welds and is less in surface area than the metal bellows. This prevents undesirable generation of metal powder and a large amount of gases, accumulation of gases and occurrence of leakage, provides super vacuum/ super clean environments, and increases the service life of the machine.

FIG. 2 shows a vacuum-oriented vertical transfer system according to a second embodiment of the present invention. The second embodiment differs from the first embodiment in the sense that in the former, a single linear pulse motor 21 serves both as a radial magnetic support means and a vertical transfer means.

Specifically, the linear pulse motor 21 is composed of a comb-like magnetic target 23 and a linear pulse motor body 22. The comb-like magnetic target 23 is arranged within the partition wall 2. The linear pulse motor body 22 is arranged externally of the partition wall 2. The comb-like magnetic target 23 is integrally formed on the outer peripheral surface of the rod 8 adjacent to its rear end. The linear pulse motor body 22 is positioned to face with the comb-like magnetic target 23 through the partition wall 2.

A motor drive means, not shown, sends a predetermined pulse signal to the linear pulse motor body 22. This results in upward or downward movement of the rod 8. At the same time, the linear pulse motor body 22 attracts the comb-like magnetic target 23 so as to floatingly support the rod 8 in its radial direction.

That is, the linear pulse motor 21 serves as two different means, radial magnetic support means and vertical transfer means.

In this embodiment, a pair of outer permanent magnets 14', 15' of the axial magnetic support means 20 are secured in position and are not allowed to move in a vertical direction. The inner permanent magnets 16, 17 are vertically moved with the rod 8. The outer permanent magnets 14', 15' are displaced relative to the inner permanent magnets 16, 17 if they are short, like the outer permanent magnets 14, 15 shown in FIG. 1. In such a case, no magnetic force is produced. In other words, the axial magnetic support means loses its function (fails to floatingly support the rod in a radial direction). To this end, the outer permanent magnets 14', 15' of this embodiment are sufficiently long so as to cover the stroke of the inner permanent magnets 16, 17, as shown in FIG. 2.

Operation of the vacuum-oriented vertical transfer system according to the second embodiment will now be described with reference to FIG. 2.

With this vacuum-oriented vertical transfer system, the rod 8 is floatingly supported in its axial direction under a repulsive force between the inner permanent magnets 16, 17 and the outer permanent magnets 14', 15'. As the liner pulse motor 40 is actuated, the rod 8 is moved in a vertical direction. Simultaneously, the linear pulse motor body 22 produces an attraction force to floatingly support the rod 8 in its radial direction. That is, the rod 8 is vertically moved within the vacuum container 1 and the partition wall 2 while it is floatingly supported in its axial and radial directions by means of the inner and outer permanent magnets 14 to 17 and the linear pulse motor 21. This vertical movement of the rod 8 allows for vertical transfer of the workpiece W to and from the front end of the rod 8.

With the vacuum-oriented vertical transfer system of the second embodiment, the rod 8 is vertically moved without being subjected to expansion and contraction while it is floatingly supported within the vacuum container 1 under a magnetic force, as in the first embodiment. The second embodiment eliminates the need for a metal bellows as in the prior art system. Advantageously, the rod 8 has no bellows or welds and is less in surface area than the metal bellows. This prevents generation of metal powder and a large amount of gases, accumulation of gases and occurrence of leakage, provides super vacuum/super clean environments, and increases the service life of the machine.

The second embodiment is particularly designed to reduce the size of the assembly since a single linear pulse motor 21 serves as both radial magnetic support means and vertical transfer means.

A gate valve assembly according to a third embodiment of the present invention will now be described with reference to FIGS. 4 to 8.

As shown in FIG. 4, the gate valve assembly includes a closure member 41 within the vacuum container 1. The closure member 41 is positioned to face with the port 9 of the vacuum container 1. A neck 40 extends from one side of the closure member 41 and is in the form of a rod.

The neck 40 is vertically moved through the through opening or open bottom 3 of the vacuum container 1. The neck 40 has a front end 40a located within the vacuum container 1 and a rear end 40b located within the partition wall 2 which in turn, separately forms a vacuum environment and an atmospheric environment.

The partition wall 2 is provided externally of the vacuum container 1 and is cylindrical in shape. The partition wall has one end open to the open bottom 3 and fixedly secured to the vacuum container and the other end closed by a lid 4.

The vacuum container 1 and the partition wall 2 are secured together by the flange 5 extending from the outer peripheral edge of the partition wall 2 and screws (not shown) for providing a connection between the vacuum container 1 and the partition wall 2. The sealing members 7 are disposed between the flange 5 and the vacuum container 1 to provide a seal therebetween.

The radial magnetic support means 10 is arranged adjacent to the outer peripheral surface of the partition wall 2 and generally includes the radial electromagnet section 11 and radial displacement sensor section (not shown).

Figure 5:
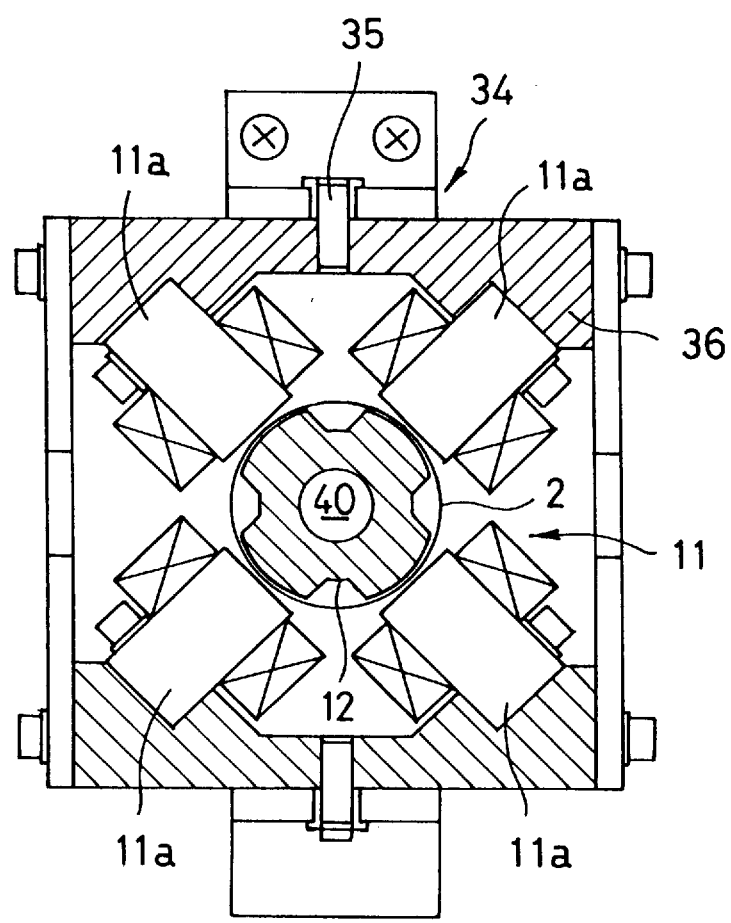
FIG. 5 is a sectional view taken on the line II—II of FIG. 4.

As shown in FIG. 5, the radial electromagnet section 11 is composed of a plurality of electromagnets !1a arranged around the outer peripheral surface of the partition wall 2. The radial displacement sensor section, not shown, detects radial displacement of the neck 40 and sends a corresponding output to a control circuit (not shown). The control circuit, in turn, controls an exciting current to the radial electromagnet section 11 based on the result sensed by the radial displacement sensor section so as to adjust the extent of an attraction force of the radial electromagnet section.

The magnetic target 12 is disposed within the partition wall 2 and integrally formed on the outer peripheral surface of the neck 40 in a face-to-face relation to the radial electromagnet section 11 through the partition wall 2.

With the radial magnetic support means 10, the radial electromagnet section 11 produces a magnetic force so as to attract the magnetic target 12 and thus, to floatingly support the neck 40 in its radial direction.

As shown in FIG. 4, a pair of upper and lower outer permanent magnets 14, 15 are arranged adjacent to the outer peripheral surface of the partition wall 2. A pair of upper and lower inner permanent magnets 16, 17 are disposed within the partition wall 2. The outer permanent magnets 14, 15 are located at opposite sides of the radial electromagnet section 11 and face with the inner permanent magnets 16, 17 through the partition wall 2. The inner permanent magnets 16, 17 are located at opposite sides of the magnetic target 12 and integrally formed on the neck 40.

The outer permanent magnets 14, 15 are repulsively arranged relative to the inner permanent magnets 16, 17. The upper outer permanent magnet 14 is located slightly closer to the open bottom 3 than the upper inner permanent magnet 16. The lower outer permanent magnet 15 is located slightly closer to the closure member 4 than the lower inner permanent magnet 17.

A repulsive force between the outer permanent magnets 14, 15 and the inner permanent magnets 16, 17 floatingly supports the neck 40 in its axial direction and bears an axial load (thrust force) exerted on the neck 40.

The radial electromagnet section 11, the radial displacement sensor section (not shown), and the outer permanent magnets 14, 15 are all mounted to a block 36. A rotary mechanism 34 is disposed adjacent to the block 36 and serves as a swing means.

The rotary mechanism 34 is to rotate the block 36 in a fixed direction about a rotary pin 35. When the block is rotated in opposite directions by the rotary mechanism 34, the neck 40 is swung in a to-and-fro direction.

The neck 40 is swung in a direction toward and away from the port 9 of the vacuum container 1.

The block 36 in its entirety is moved along the partition wall 2. This reciprocable motion of the block 36 is effected by a slide mechanism. When the block 36 is reciprocated, the neck 40 is moved in the same direction as the block 36.

A cylindrical seal block 42 and resilient seals or o-rings 43 are disposed between the port 9 of the vacuum container 1 and the closure member 41. The cylindrical seal block has a rear end mounted to the open edge of the port 9 and a front end oriented to face with the closure member. The o-rings are mounted to the closure member 41 to provide a seal between the seal block 42 and the closure member 41.

The closure member 41 is made of a magnetic material. A sealing electromagnet 44 is mounted to the port 9 of the vacuum container 1. The sealing electromagnet 44 is arranged on the outer peripheral surface of the seal block 42 and adapted to attract the closure member 41 so as to plastically deform the o-rings 43.

Operation of the gate valve assembly thus constructed will next be described with reference to FIGS. 4 to 6.

With this gate valve assembly, when the radial magnetic support means 10 is actuated, the radial electromagnet section 11 attracts the magnetic target 12 so as to floatingly support the neck 40 in its radial direction.

In addition, a repulsive force between the outer permanent magnets 14, 15 and the inner permanent magnets 16, 17 floatingly supports the neck 40 in its axial direction.

That is, radial and axial floating support of the neck 40 are effected independently by the radial electromagnet section 11 and the outer permanent magnets 14, 15.

When the entire block 36 is reciprocated along the partition wall 2 while the neck 40 is floatingly supported as explained above, the neck 40 is reciprocated in the same direction as the block 36. This associated reciprocation is used to arrange the closure member 41 in a face-to-face relation to the port 9 of the vacuum container 1.

Thereafter, the rotary mechanism 34 is operated to swing the closure member 41 into close contact with the port 9.

Specifically, the block 36 is rotated by a fixed angle. The neck 40 is synchronously rotated in the same direction. The closure member 41 is moved toward the port 9 and then, brought into contact with the seal block 42.

After the closure member has been contacted with the seal block, an exciting current is applied to the sealing electromagnet 44 whereby the closure member is attracted to the sealing electromagnet. This results in plastic deformation of the o-rings and thus, complete closure of the port 61.

To open the port 9, operation is effected in a reverse order. Specifically, application of the current to the sealing electromagnet 44 is stopped. Thereafter, the closure member 41 is swung away from the port 9. To separate the closure member from the port 9, the block 36 is rotated in an opposite direction.

Figure 7:
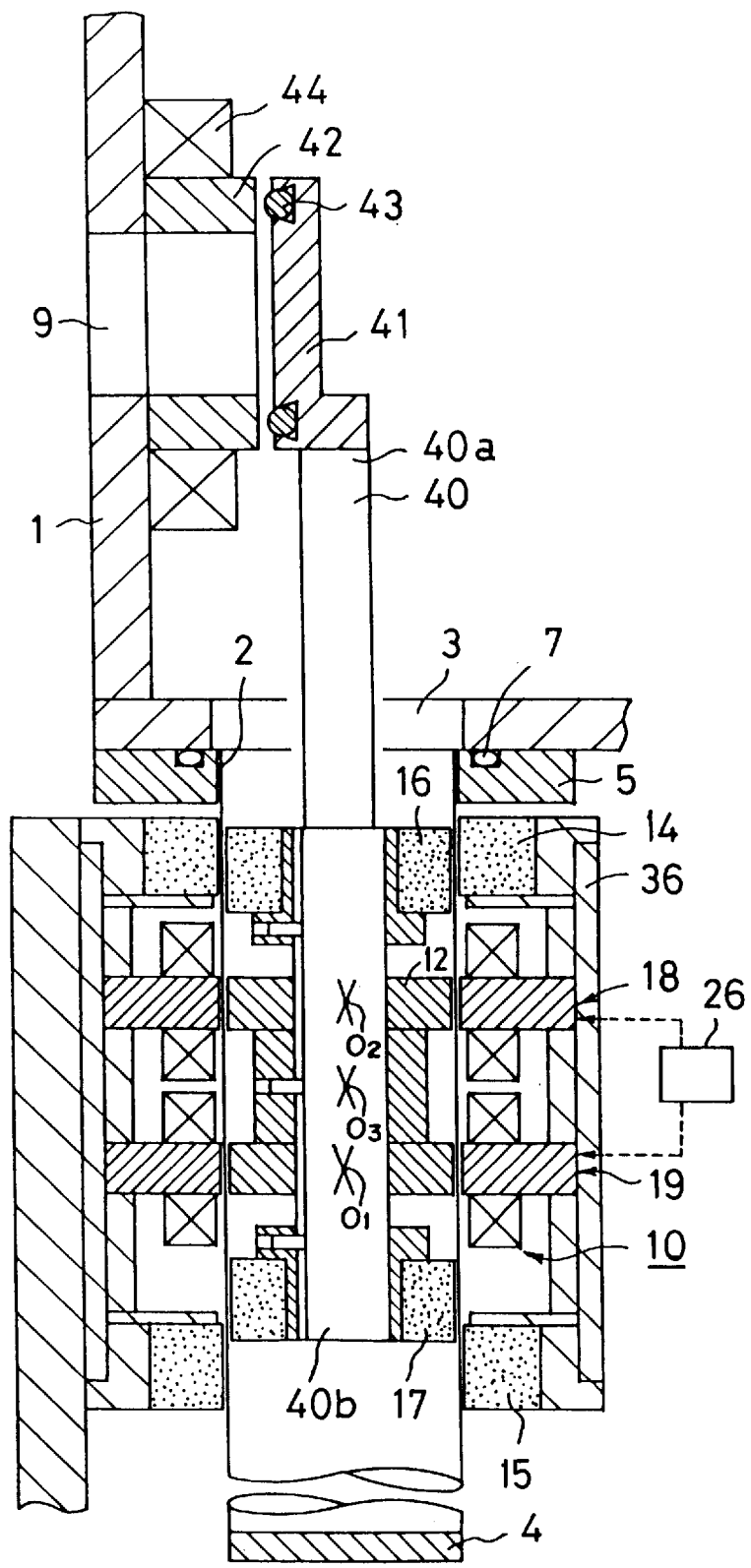
FIG. 7 is a sectional view of a gate valve assembly according to a second embodiment of the present invention.

FIG. 7 shows another embodiment of the present invention. A gate valve assembly shown in FIG. 7 differs from that of the previous embodiment in the sense that the radial magnetic support means 10 of the former includes first and second radial electromagnet sections 18, 19, and a swing controller 26 as a swing means.

Specifically, the radial magnetic support means 10 produces a magnetic force so as to radially support the neck 40 at two points. To this end, the first and second radial electromagnet sections 18, 19 are arranged along the axis of the neck 40. The first and second radial electromagnet sections 18, 19 are both composed of a plurality of electromagnets as in the previous embodiment.

The swing controller 26 is operable to control an exciting current to the first electromagnet section 18 and/or an exciting current to the second electromagnet section 19 so as to change the radial position of the neck 40 and allow for swing motion of the neck 40.

That is, the extent of an attraction force produced by the first radial electromagnet section 18 or second radial electromagnet section 19 is adjusted under the control of an exciting current. This allows for a change in the radial position of the neck 40 by means of the first radial electromagnet section 18 and/or the second radial electromagnet section 19. The swing controller 26 is constructed to control an exciting current so as to change floating position of the neck 40 and allow for swing motion of the neck 40.

When an exciting current is applied only to the first radial electromagnet section 18, the neck 40 is swung about a fulcrum O1 of the second electromagnet section 19. When an exciting current is applied only to the second radial electromagnet section 19, the neck 40 is swung about a fulcrum O2 of the first radial electromagnet section 18. When an exciting current is applied to both the first and second electromagnet sections 18, 19, the neck 40 is swung about a fulcrum O3 located between the first and second electromagnet sections 18, 19.

The neck 40 is designed to swing in a direction toward and away from the port 9 of the vacuum container 1 as in the previous embodiment.

Operation of the gate valve assembly thus constructed will now be described with reference to FIG. 7.

With this gate valve assembly, radial floating support of the neck 40 is effected by the first and second radial electromagnet sections 18, 19, whereas axial floating support of the neck 40 is effected by the outer permanent magnets 14, 15. While the neck 40 is floatingly supported as such, the block 36 in its entirety is reciprocated along the partition wall 2. The neck 40 is also reciprocated in the same direction as the block 36. This reciprocating motion of the neck 40 allows the closure member 41 to face with the port 9 of the vacuum container 1.

Thereafter, the swing controller 26 is operable to control an exciting current to the radial electromagnet section 18 so as to cause swing motion of the neck to move the closure member 41 into close contact with the port 9.

That is, the neck 40 is rotated about the fulcrum of the radial electromagnet section 18 so as to move the closure member 41 toward the port 9. The closure member 41 is then brought into contact with the seal block 42.

After the closure member 41 has been contacted with the seal block 42, the sealing electromagnet 44 attracts the closure member 41 to thereby cause plastic deformation of the o-rings 43 and thus, complete closing of the port 9, as in the previous embodiment. To open the port 9, operation is effected in a reverse manner.

Figure 8:
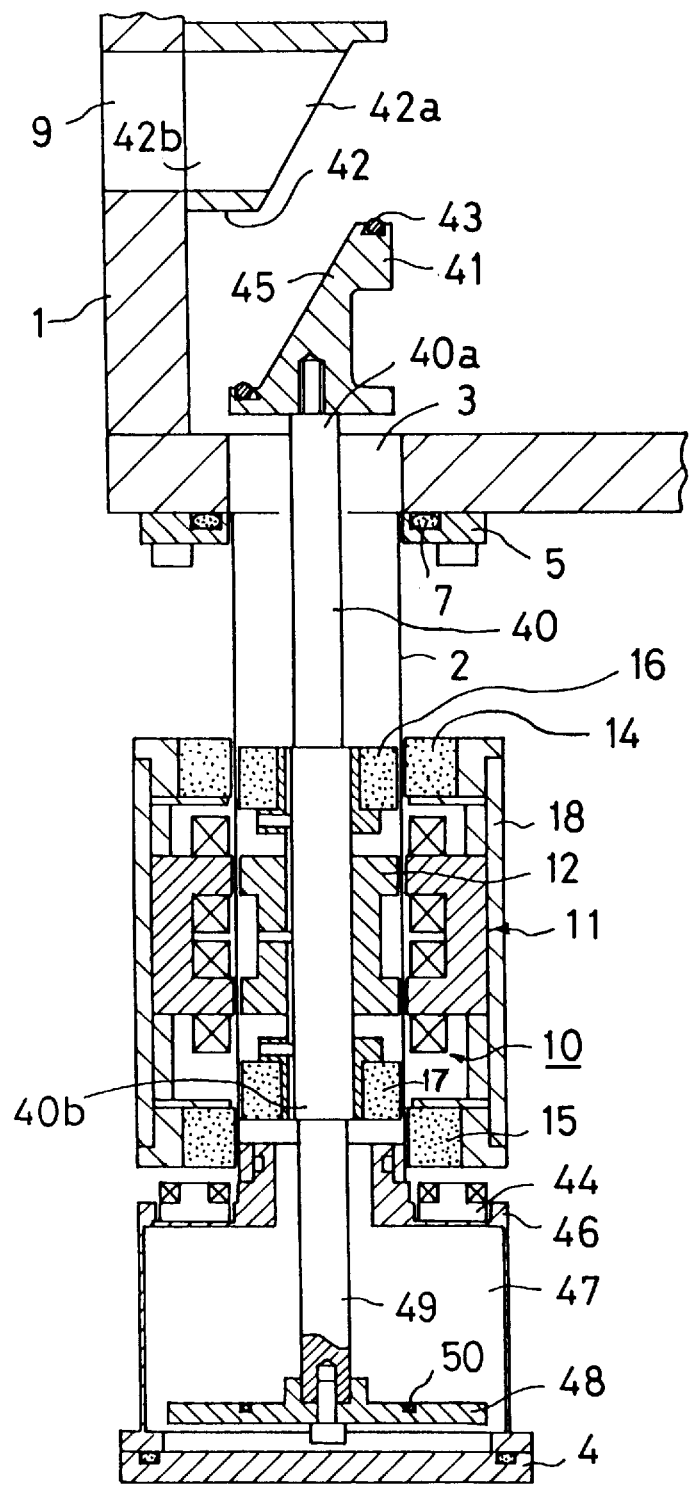
FIG. 8 is a sectional view of a gate valve assembly according to a third embodiment of the present invention.
Figure 9:
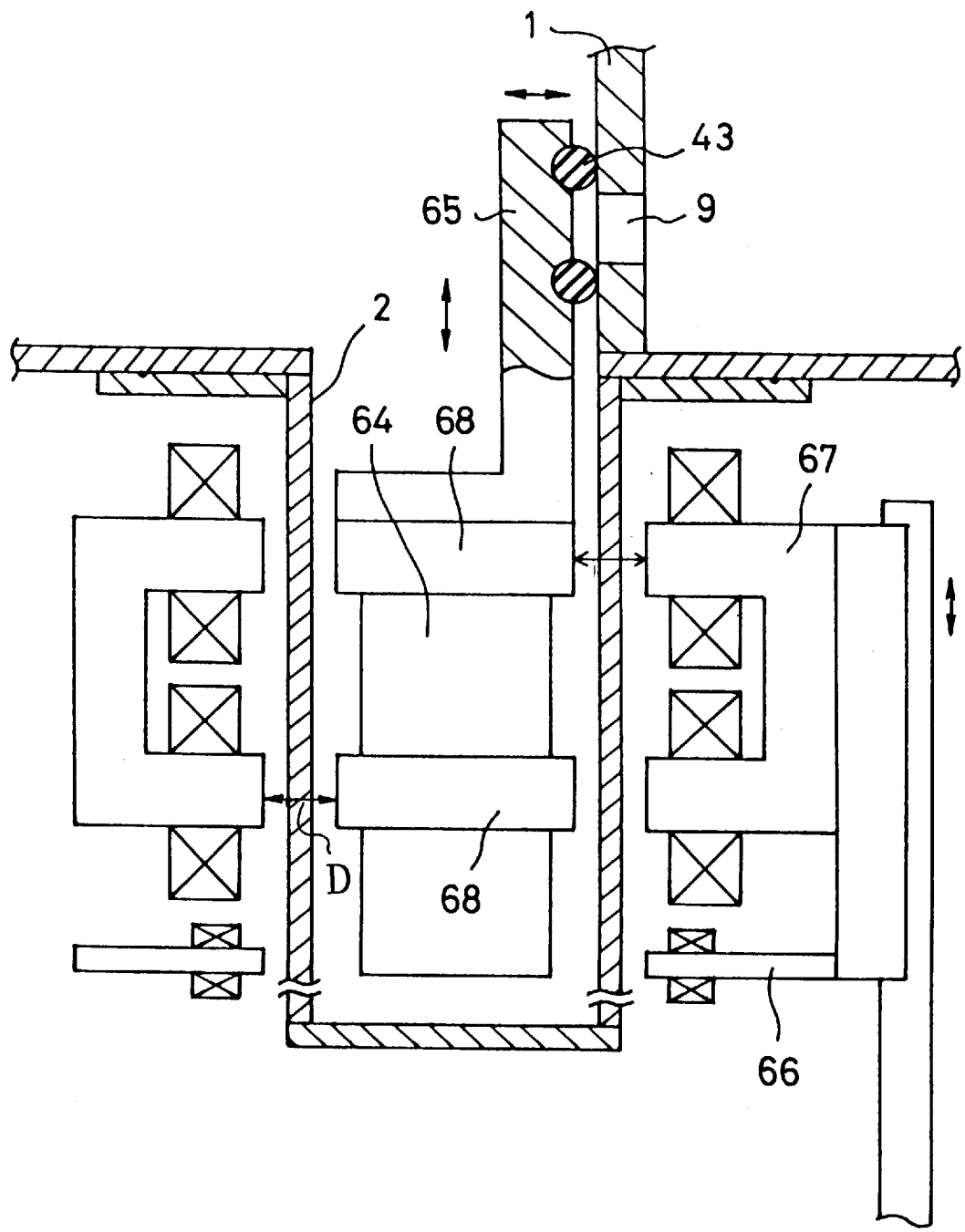
FIG. 9 is a sectional view of a conventional gate valve assembly.

FIG. 8 shows a further embodiment of the present invention. Like parts are given like numerals.

The gate valve assembly shown in FIG. 8 includes a cylindrical seal block 42 as in the previous embodiment. However, the seal block 42 of this embodiment is different from that of the previous embodiment in that the seal block 42 has a front, inclined end 42a. The cylindrical seal block 42 is obliquely cut at a certain angle. The seal block 42 has a rear end 42b connected to the open edge of the port 9 of the vacuum container 1 as in the previous embodiment.

The closure member is disposed adjacent to the inclined end 42a of the seal block. The closure member 41 has an inclined portion 45 corresponding to the inclined end 42a. The inclined angle of the inclined end 42a is equal to that of the inclined portion 45.

A plurality of o-rings 43 are provided between the inclined portion 45 and the inclined end 42a. The o-rings 43 are attached to the closure member 41 to provide a seal between the inclined end 42a and the inclined portion 45.

The neck 40 extends from the lower end of the closure member 41. The neck 40 and associated members are vertically moved through the open bottom of the vacuum container 1. The neck has a rear end 40b located within the partition wall 2. The partition wall 2 is provided externally of the vacuum container 1. The radial magnetic support means 10 and the outer permanent magnets 14, 15 are provided adjacent to the outer peripheral surface of the partition wall 2. With the radial magnetic support means, the radial electromagnet section 11 produces a magnetic force so as to attract the magnetic target 12 and thus, to floatingly support the neck in its radial direction. The outer permanent magnets 14, 15 cooperate with the inner permanent magnets 16, 17 to produce a repulsive force so as to floatingly support the neck in its axial direction. This arrangement is identical to that of the previous embodiment and will not be described herein.

The neck 40 has an intermediate step 46. An enlarged chamber 47 is defined between the intermediate step 46 and the lid 4 and has a large diameter. An attraction plate 48 is disposed within the enlarged chamber. A sealing electromagnet 44 is disposed externally of the enlarged chamber 47.

The attraction plate 48 is integrally connected to the rear end 40b of the neck 40 through a connecting rod 49. The sealing electromagnet 44 is arranged to face with the attraction plate 48 and adapted to axially attract the neck 40 through the attraction plate 48 so as to cause plastic deformation of the o-rings 43.

A cushion member 50 is arranged on the attraction plate 48 so as to reduce shock loads during attraction.

Operation of the gate valve assembly thus constructed will now be described with reference to FIG. 8.

With this gate valve assembly, too, radial floating support of the neck is effected by the radial electromagnet section 11, and axial floating support of the neck 40 is effected by the outer permanent magnets 14,15, independently.

While the neck 40 is floatingly supported as explained earlier, the block 36 in its entirety is raised along the partition wall 2. The neck 40 is upwardly moved with the block. The inclined portion 45 of the closure member 41 is then moved toward and faces with the inclined end 42a of the seal block 42.

Thereafter, an exciting current is applied to the sealing electromagnet 44. This causes the sealing electromagnet 44 to axially attract the neck 40 through the attraction plate 48. This attraction results in plastic deformation of the o-rings 43 and thus, complete closing the port 9. To open the port 9, operation is carried out in a reverse order.

In any of the foregoing embodiments, the outer permanent magnets 14,15 bear a thrust load from the neck 40. Plastic deformation of the o-rings is effected by the sealing electromagnet 44. As such, the radial electromagnet sections 11,18 and 19 only serve to radially support the neck in a floating fashion. This brings about a reduction in the size of the radial magnetic support means, and also, in the size and production cost of the overall assembly. Also, this reduces the amount of heat generated by the electromagnet section.

Particularly, in the first and second embodiments, the neck 40 is swung, rather than radially translated, in order to open and close the port 9. Only by slightly swinging the neck 40, the closure member 41 is substantially moved in a to-and-fro direction. In this way, the neck 40 can have a sufficient stroke to open and close the port 9. Only a small space is required between the radial electromagnet section 11 and the magnetic target 12 of the neck 40 to allow for rotation of the neck 40 at a small angle. This also results in the size of the radial electromagnet section.

In the third embodiment, the neck 40 is axially moved in a to-and-fro direction, rather than translated in a radial direction, in order to open and close the port 9. No space is required between the radial electromagnet section 11 and the magnetic target 12 of the neck 40 to allow for radial translation of the neck. This also results in the size of the radial electromagnet section as in the previous embodiments.

As explained earlier, in the vacuum-oriented vertical transfer system of the present invention, the rod is floatingly supported under a magnetic force and vertically moved within the vacuum container without being subjected to expansion and contraction. This arrangement eliminates the need for a metal bellows as in the prior art system. The rod has no bellows or welds and is less in surface area than the metal bellows. This prevents undesirable generation of metal powder and a large amount of gases, accumulation of gases and occurrence of leakage, makes it possible to provide super vacuum/super clean environments, and increases the service life of the system. Further, the permanent magnets constitute axial magnetic support means, and a magnetic force allows for axial floating support. This prevents dropping in the event of no power supply.

In the gate valve assembly of the present invention, the outer permanent magnets bear a thrust load from the neck. The radial electromagnet section only serves to radially support the neck in a floating fashion. This brings about a reduction in the size of the radial electromagnet section and thus, in the size and production cost of the overall assembly, and reduces the amount of heat generated by the electromagnet section.

Particularly, in the gate valve assembly wherein to open and close the port, the closure member is swung rather than radially translated, when the neck is only slightly swung, the closure member is substantially moved in a to-and-fro direction. Thus, the closure member can have a sufficient stroke to open and close the port. Only a small space is required between the radial electromagnets and the neck in order to slightly rotate the neck. This results in a decrease in the size of the radial electromagnets.

Further, the closure member is reciprocated in an axial direction rather than translated in a radial direction during opening and closing of the port. Thus, no space is required between the radial electromagnets and the magnetic target of the neck to allow for radial translation of he neck. This also results in a decrease in the size of the radial electromagnets.

What is claimed is:

1. A vacuum-oriented vertical transfer system comprising:
   a cylindrical partition wall provided externally of a vacuum container, the cylindrical partition wall having a first end open to an open bottom of the vacuum container and a second closed end;
   a rod capable of vertical movement through the open bottom of the vacuum container, the rod having a front end located within the vacuum container and a rear end located within the partition wall;
   radial magnetic support means for applying a magnetic force from outside of the partition wall to floatingly support the rod in a radial direction;
   axial magnetic support means for applying a magnetic force from outside of the partition wall to floatingly support the rod in an axial direction; and
   vertical transfer means for vertically moving the radial magnetic support means along the partition wall.

2. A vacuum-oriented vertical transfer system according to claim 1, wherein the radial magnetic support means comprises a magnetic target integrally mounted to an outer peripheral surface of the rod, and radial electromagnets arranged adjacent to the outer peripheral surface of the partition wall and adapted to attract the magnetic target; wherein the axial magnetic support means comprises inner permanent magnets integrally mounted to the outer peripheral surface of the rod, and outer permanent magnets arranged adjacent to the outer peripheral surface of the partition wall and adapted to produce a repulsive force relative to the inner permanent magnets; and wherein the vertical transfer means comprises a transfer body and a transfer mechanism for vertically moving the transfer body along the partition wall, and wherein the radial electromagnets and the outer permanent magnets are integrally mounted to the transfer body.

3. A vacuum-oriented vertical transfer system according to claim 1; wherein the radial magnetic support means and the vertical transfer means comprise a linear pulse motor body arranged adjacent to the outer peripheral surface of the partition wall, and a comb-like magnetic target integrally attached to the outer peripheral surface of the rod in face-to-face relation to the linear pulse motor body.

4. A gate valve assembly comprising:
   a closure member arranged to face with a port of a container;

a neck integrally formed on one side of the closure member;

radial magnetic support means for floatingly supporting the neck in a radial direction under a magnetic force;

inner permanent magnets integrally connected to the neck;

outer permanent magnets for floatingly supporting the neck in an axial direction under a repulsive force generated between the outer permanent magnets and the inner permanent magnets; and swing means for swinging the neck back and forth toward the port of the container, whereby the port is opened and closed by the closure member.

5. A gate valve assembly according to claim 4; wherein the swing means comprises a rotary mechanism for rotating the radial magnetic support means and the outer permanent magnets.

6. A gate valve assembly according to claim 4; wherein the radial magnetic support means comprises a first radial electromagnet section and a second radial electromagnet section arranged along the axis of the neck; and wherein the swing means comprises a swing controller for controlling an exciting current to at least one of the first and the second radial electromagnet sections so as to change a radial floating position of the neck.

7. A gate valve assembly according to claim 4; wherein the closure member is comprised of a magnetic material; and further comprising a resilient seal member disposed between the port of the container and the closure member, and a sealing electromagnet for attracting the closure member toward the port of the container.

8. A gate valve assembly comprising:

a cylindrical seal block having an inclined front end and a rear end connected to a port of a container;

a closure member located adjacent to the seal block and having an inclined portion arranged in face-to-face relation to the inclined front end of the seal block;

a resilient seal member disposed between the inclined portion of the closure member and the inclined front end of the seal block;

a neck mounted to a lower end of the closure member;

a radial electromagnet section for floatingly supporting the neck in a radial direction under a magnetic force;

inner permanent magnets integrally mounted to the neck;

outer permanent magnets for floatingly supporting the neck in an axial direction under a repulsive force generated between the outer permanent magnets and the inner permanent magnets; and a sealing electromagnet for axially attracting the neck, whereby the inclined portion of the closure member is brought into close contact with the inclined front end of the seal block.

9. A gate valve assembly according to claim 4; wherein the radial magnetic support means comprises a magnetic target integrally connected to the neck; and an electromagnet section disposed opposite to and spaced from the magnetic target.

10. A transfer system comprising:

an enclosure having a closed end and an open end for connection to an open end of a vacuum container to provide a vacuum environment within the enclosure;

a transfer member extending into the enclosure for movement through the open end of the enclosure and the open end of the vacuum container in an axial direction of the transfer member;

radial magnetic means for floatingly supporting the transfer member by magnetic forces in a radial direction thereof;

axial magnetic means for floatingly supporting the transfer member by magnetic forces in the axial direction; and transfer means for moving the radial magnetic means and the axial magnetic means in the axial direction.

11. A transfer system according to claim 10; wherein the radial magnetic means comprises a magnetic target integrally connected to an outer peripheral surface of the transfer member, and at least one radial electromagnet disposed adjacent to and spaced from an outer peripheral surface of the enclosure for magnetically attracting the magnetic target.

12. A transfer system according to claim 11; wherein the axial magnetic means comprises at least one first electromagnet integrally connected to the outer peripheral surface of the transfer member, and at least one second electromagnet disposed adjacent to and spaced from the outer peripheral surface of the enclosure for producing a magnetic repulsive force with the first electromagnet.

13. A transfer system according to claim 12; wherein the transfer means comprises a transfer body and a transfer mechanism for moving the transfer body in the axial direction, the radial electromagnet and the second electromagnet being integrally connected to the transfer body.

14. A transfer system according to claim 10; wherein the radial magnetic means and the transfer means comprise a linear pulse motor.

15. A transfer system according to claim 14; wherein the linear pulse motor comprises a linear pulse motor body disposed adjacent to and spaced from an outer peripheral surface of the container, and a magnetic target having a comb-shaped outer peripheral surface and being integrally connected to an outer peripheral surface of the transfer member opposite to the linear pulse motor body.

16. A gate valve assembly comprising:

a closure member mounted for positioning adjacent to and away from a port of a container to close and open the port, respectively;

a neck member integrally connected to the closure member and mounted for movement to position the closure member to open and close the port of the container;

radial magnetic means for floatingly supporting the neck member by magnetic forces in a radial direction thereof;

axial magnetic means for floatingly supporting the neck member by magnetic forces in an axial direction thereof; and moving means for moving the neck member to position the closure member to open and close the port of the container.

17. A gate valve assembly according to claim 16; wherein the moving means comprises a rotary mechanism for rotating the radial magnetic means and the axial magnetic means.

18. A gate valve assembly according to claim 16; wherein the radial magnetic means comprises two radial electromagnet sections disposed along the axial direction of and spaced from the neck member; and wherein the moving means comprises a controlling device for controlling an exciting current supplied to at least one of the radial electromagnet sections to change a radial floating position of the neck member.

19. A gate valve assembly according to claim 16; wherein the closure member is comprised of a magnetic material.

20. A gate valve assembly according to claim 19; further comprising a seal member connected to the closure member for providing a seal between the closure member and the port of the container when the closure member closes the port.

21. A gate valve assembly according to claim 20; further comprising an electromagnet for magnetically attracting the closure member toward the port of the container to close the port.

22. A gate valve assembly comprising:

a block member having a first open end for connection to a port of a container, and a second open end;

a closure member for positioning adjacent to and away from the second open end of the block member to close and open the port of the container, respectively;

a neck member integrally connected to the closure member;

radial magnetic means for floatingly supporting the neck member by magnetic forces in a radial direction thereof;

axial magnetic means for floatingly supporting the neck member by magnetic forces in an axial direction thereof; and electromagnetic means for moving the neck member by magnetic forces in the axial direction to bring the closure member adjacent to the second open end of the block member to close the port of the container.

23. A gate valve assembly according to claim 22; wherein the second open end of the block member has an inclined peripheral surface; and wherein the closure member has an inclined surface for mating engagement with the inclined peripheral surface of the block member to close the port of the container.

* * * * *